(12) United States Patent
Hsieh

(10) Patent No.: US 6,822,284 B2
(45) Date of Patent: Nov. 23, 2004

(54) ONO DIELECTRIC FOR MEMORY CELLS

(75) Inventor: Jung-Yu Hsieh, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 10/414,048

(22) Filed: Apr. 16, 2003

(65) Prior Publication Data

US 2004/0207000 A1 Oct. 21, 2004

(51) Int. Cl.$^7$ .............................................. H01L 29/76
(52) U.S. Cl. ........................ 257/314; 257/315; 257/316
(58) Field of Search ................................ 257/314–316

(56) References Cited

U.S. PATENT DOCUMENTS 6,265,268 B1    7/2001   Halliyal et al.

2002/0117709 A1 * 8/2002 Weimer et al. ............. 257/315
2003/0148629 A1 * 8/2003 Ohmi et al. ................ 438/778

* cited by examiner

*Primary Examiner*—Dung A. Le
(74) *Attorney, Agent, or Firm*—Finnegan, Henderson, Farabow, Garrett & Dunner, L.L.P.

(57) ABSTRACT

A method of fabricating a semiconductor device includes providing a wafer substrate, forming a first oxide layer over the wafer substrate using a single wafer low pressure chemical vapor deposition oxidation process, forming a second oxide layer over the first oxide layer by a single wafer oxidation process, forming a nitride layer over the second oxide layer using a low temperature and pressure deposition process, and growing a top oxide layer over the nitride layer.

5 Claims, 2 Drawing Sheets

• ONO fabricated by a conventional single wafer process
▲ ONO fabricated according to the process consistent with the invention

ONO DIELECTRIC FOR MEMORY CELLS

TECHNICAL FIELD

The invention relates generally to semiconductor devices and fabrication methods and, more particularly, to an ONO dielectric for flash memory cells and method for fabricating the same.

BACKGROUND

A semiconductor memory product generally includes a memory array that comprises a matrix of memory cells. One type of semiconductor device is a flash memory device, which includes flash memory cells. Each flash memory cell includes a floating-gate electrode for storing electrical charge. The electrical charge is provided from a channel region underneath the floating-gate electrode. The floating-gate electrode typically includes a dielectric material for storing the electrical charge. A common dielectric structure for a floating-gate electrode is an oxide-nitride-oxide ("ONO") structure.

This type of structure plays a role in determining operating characteristics and reliability of the flash memory device. For example, a high quality ONO dielectric structure should provide, e.g., low defect density, long mean time to failure, and high charge retention capability.

One method for forming an ONO dielectric uses a single wafer thermal process. However, because of short reaction time, this process produces an ONO dielectric material with an undesirably low density structure. Due to the low density of the structure, the ONO material may be encroached during the subsequent manufacturing process, resulting in a decreased gate coupling ratio ("GCR") and low yields.

SUMMARY OF THE INVENTION

In accordance with the invention, there is provided a method of fabricating a semiconductor device that includes providing a wafer substrate, forming a first oxide layer over the wafer substrate using a single wafer low pressure chemical vapor deposition oxidation process, forming a second oxide layer over the first oxide layer by a single wafer oxidation process, forming a nitride layer over the second oxide layer using a low temperature and pressure deposition process, and growing a top oxide layer over the nitride layer.

Also in accordance with the invention, there is provided a method of manufacturing a semiconductor device that includes providing a wafer substrate, forming a first oxide layer over the wafer substrate using a single wafer low pressure chemical vapor deposition oxidation process, first oxide layer having a first etch rate, forming a second oxide layer over the first oxide layer by a single wafer oxidation process, second oxide layer having a second etch rate, forming a nitride layer over the second oxide layer, the second oxide layer having a third etch rate, and growing a top oxide layer over the nitride layer, wherein the third etch rate is greater than the first etch rate and the second etch rate.

Further in accordance with the present invention, there is provided a semiconductor device that includes a substrate, and a floating-gate electrode formed over the substrate. The floating-gate electrode includes a first oxide layer formed over the substrate, a second oxide layer formed over the first oxide layer, a nitride layer formed over the second oxide layer, and a top oxide layer formed over the nitride layer, wherein the first oxide layer is formed using a single wafer low pressure chemical vapor deposition oxidation process, the second oxide layer is formed by a single wafer oxidation process, and the nitride layer is formed using a low temperature and pressure deposition process.

Additional features and advantages consistent with the invention will be set forth in part in the description which follows, and in part will be obvious from the description, or may be learned by practice of the invention. The features and advantages consistent with the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate exemplary embodiments of the invention and together with the description, serve to explain the principles of the invention.

DESCRIPTION OF THE EMBODIMENTS

Reference will now be made in detail to present embodiments of the invention, examples of which are illustrated in the accompanying drawings. Wherever possible, the same reference numbers will be used throughout the drawings to refer to the same or like parts.

Figure 1:
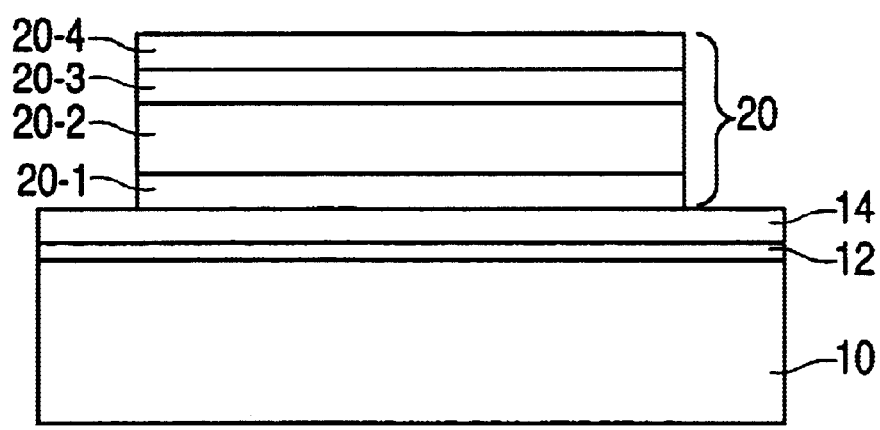
FIG. 1 is a cross-sectional view of semiconductor device manufactured consistent with one embodiment of the present invention.

Referring to FIG. 1, a semiconductor wafer substrate 10, such as a silicon substrate, is provided for forming active devices. A tunnel oxide 12 is formed or deposited over substrate 10 by conventional processes, and may be composed of silicon dioxide ($SiO_2$), silicon oxynitride ($SiO_xN_y$), or a combination thereof. A polysilicon layer 14 is formed over tunnel oxide 12 by, for example, low pressure chemical vapor deposition (LPCVD) at about 500–700° C. Polysilicon layer 14 can act as a floating-gate, and is referred to hereinafter as floating-gate 14.

A stacked dielectric film or material 20 is then formed over floating-gate 14. Dielectric film 20 includes a first oxide layer 20-1, a second oxide layer 20-2, a nitride layer 20-3, and a top oxide layer 20-4. Dielectric film 20 can also be referred to as an ONO dielectric structure. First oxide layer 20-1 is formed over floating-gate 14 by a single wafer LPCVD oxidation process. Second oxide layer 20-2 is formed over first oxide layer 20-1 by a single wafer oxidation process. Specifically, second oxide layer 20-2 is formed through a reaction of first oxide layer 20-1 with polysilicon layer 14. During the formation of second oxide layer 20-2, first oxide layer 20-1 becomes denser. In one embodiment, first oxide layer 20-1 has an initial thickness of about 15–30 angstroms. After formation of second oxide layer 20-2, first oxide layer 20-1, together with second oxide layer 20-2, has a total thickness of about 35–50 angstroms.

Nitride layer 20-3 is then formed over second oxide layer 20-2 using a low temperature and pressure chemical vapor deposition process, wherein $SiH_4$ and $NH_3$ are introduced as reaction gases. In one embodiment, the process for depositing nitride layer 20-3 proceeds at a temperature of about 650–710° C. and under a pressure of about 200–300 torr. In one embodiment, nitride layer 20-3 has an initial thickness of about 90–110 angstroms.

Next, the top oxide layer 20-4 is formed over nitride layer 20-3 to complete the single wafer ONO process. In one embodiment, the top oxide layer 20-4 is formed by in-situ steam generation ("ISSG"). In another embodiment, the top oxide layer 20-4 is formed by $H_2/O_2$ wet oxidation. During the formation of top oxide layer 20-4, a portion of nitride layer 20-3 is converted to an oxide. As a result, nitride layer 20-3 has a reduced thickness of about 50–70 angstroms.

Figure 2:
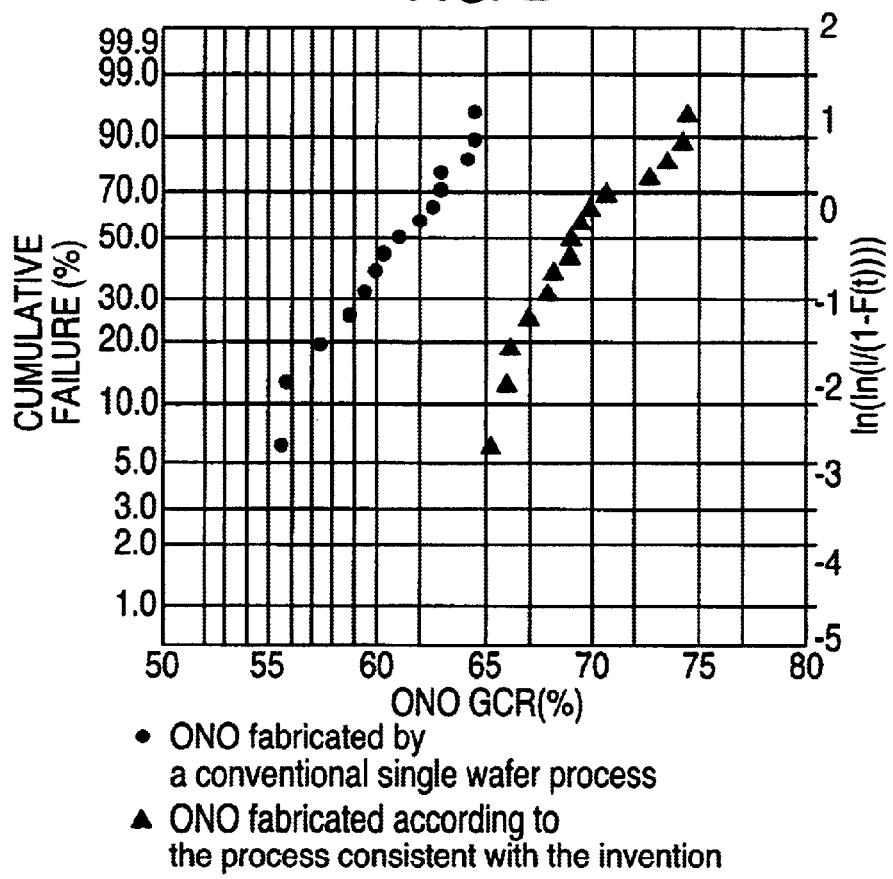
FIG. 2 is a chart comparing the GCR of ONO dielectrics fabricated using the conventional single wafer process and a method consistent with one embodiment of the present invention.
Figure 3:
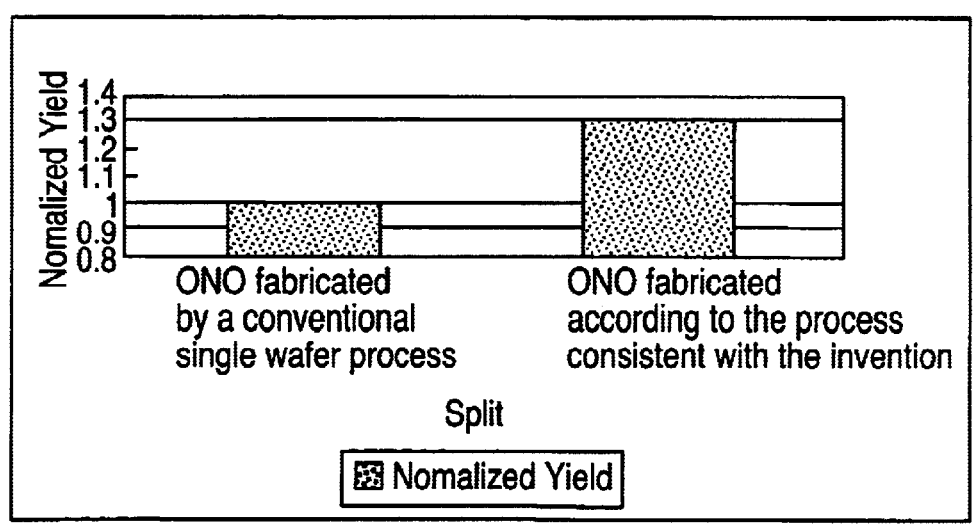
FIG. 3 is a table showing normalized yields of ONO dielectrics fabricated with the conventional single wafer process and a method consistent with one embodiment of the present invention.

Oxide layers 20-1, 20-2, and 20-4 fabricated according to the process consistent with the invention are denser in structure, thereby resulting in a lower breakdown voltage, higher GCR, and improved yields as compared to oxide layers manufactured with conventional techniques. FIG. 2 is a chart comparing the GCR of ONO dielectrics fabricated using the conventional single wafer process and a method consistent with one embodiment of the present invention. FIG. 3 is a table showing normalized yields of ONO dielectrics fabricated with the conventional single wafer process and a method consistent with one embodiment of the present invention. From FIGS. 2 and 3, it is clear that a 9% increase in GCR performance and a 30% improvement in yields are obtained for the dielectric structures manufactured with a method consistent with one embodiment of the present invention as compared to a conventional single wafer process.

The improvements attained with the method of the present invention are attributable to the manufacturing process. During the thermal oxidation process, grain boundaries are oxidized more rapidly than the center portions. This, in turn, results in "V" shaped grooves at the interface between polyoxide and polysilicon. In fact, longer oxidation increases the size of the grooves, and therefore, increases surface roughness at the oxide/polysilicon interface. The rough surface causes an increased electric field around the "V" shaped grooves as compared to the average electric field. This discrepancy may adversely affect the operations of the memory cell. Furthermore, the oxides formed at the oxide/polysilicon interface may also adversely affect the etch rate of an wet etch process, resulting in a decrease in yields.

The present invention as described above provides a denser bottom, or first, oxide. This increase in oxide density is reflected in the subsequent wet etch process. Using a 1% diluted HF solution, the etch rate is reduced from 360 angstroms per minute to less than 100 angstroms per minute. In addition, the wet oxidation technique obtains the same wet etch rate as the oxides grown by thermal high temperature oxide (HTO), while the top oxide grown with the wet oxidation technique provides a lower wet etch rate compared to oxides grown by thermal HTO. As a result, the wet etch process is uniform and predictable, both of which result in improved yields.

The resulting structure is useful for forming the ONO dielectric structure for a flash memory cell. Although the method and device of the present invention are directed to a flash memory cell, one skilled in the art would understand that the method and device according to the invention are equally applicable to a flash memory array comprised of a matrix of flash cells.

Other embodiments of the invention will be apparent to those skilled in the art from consideration of the specification and practice of the invention disclosed herein, It is intended that the specification and examples be considered as exemplary only, with a true scope and spirit of the invention being indicated by the following claims.

What is claimed is:

1. A semiconductor device, comprising:
   a substrate; and
   a dielectric film formed over the substrate, the dielectric film including:
   a first oxide layer formed over the substrate,
   a second oxide layer formed over the first oxide layer,
   a nitride layer formed over the second oxide layer, and
   a top oxide layer formed over the nitride layer,
   wherein the first oxide layer is formed using a single wafer low pressure chemical vapor deposition oxidation process, the second oxide layer is formed by a single wafer oxidation process, and the nitride layer is formed using a low temperature and pressure deposition process, and wherein the first oxide layer becomes denser during the formation of the second oxide layer.

2. The semiconductor device of claim 1, wherein the nitride layer is formed at a temperature of about 650–710° C.

3. The semiconductor device of claim 1, wherein the nitride layer is formed under a pressure of about 200–300 torr.

4. The semiconductor device of claim 1, wherein the top oxide layer is formed by an in-situ steam generation process.

5. The semiconductor device of claim 1, wherein the top oxide layer is formed by hydrogen/oxide wet oxidation.

* * * * *